(12) United States Patent
Kwon et al.

(10) Patent No.: US 7,704,767 B2
(45) Date of Patent: Apr. 27, 2010

(54) MANUFACTURING METHOD OF ELECTRO LINE FOR LIQUID CRYSTAL DISPLAY DEVICE

(75) Inventors: Oh-Nam Kwon, Chungcheongnam-do (KR); Kyoung-Mook Lee, Seoul (KR); Heung-Lyul Cho, Seoul (KR); Seung-Hee Nam, Dae-gu (KR); Cyoo-Chul Jo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/382,422

(22) Filed: Mar. 16, 2009

(65) Prior Publication Data

US 2009/0233388 A1  Sep. 17, 2009

Related U.S. Application Data

(62) Division of application No. 10/315,151, filed on Dec. 10, 2002, now Pat. No. 7,521,366.

(30) Foreign Application Priority Data

Dec. 12, 2001  (KR) .................. 10-2001-0078557
Dec. 12, 2001  (KR) .................. 10-2001-0078558

(51) Int. Cl.
*H01L 21/84* (2006.01)
(52) U.S. Cl. .............. 438/30; 257/E21.561; 438/656; 438/754
(58) Field of Classification Search ............ 438/30, 438/656, 754; 257/E21.561
See application file for complete search history.

(56) References Cited

U.S. PATENT DOCUMENTS

| 4,962,060 | A | 10/1990 | Sliwa et al. |
| 5,868,854 | A | 2/1999 | Kojima et al. |
| 5,958,288 | A | 9/1999 | Mueller et al. |
| 6,350,995 | B1 | 2/2002 | Sung et al. |
| 6,432,819 | B1 | 8/2002 | Pavate et al. |
| 6,503,375 | B1 | 1/2003 | Maydan et al. |
| 6,876,056 | B2 | 4/2005 | Tilmans et al. |
| 6,881,664 | B2 | 4/2005 | Catabay et al. |
| 7,521,366 | B2 * | 4/2009 | Kwon et al. ............... 438/704 |
| 2001/0036804 | A1 | 11/2001 | Mueller et al. |
| 2002/0020833 | A1 | 2/2002 | Zhang et al. |

(Continued)

FOREIGN PATENT DOCUMENTS

JP  2001-068679  3/2001

(Continued)

OTHER PUBLICATIONS

English translation (machine) of JP 2001-059191.*

*Primary Examiner*—Richard A. Booth
(74) *Attorney, Agent, or Firm*—McKenna Long & Aldridge LLP

(57) ABSTRACT

A manufacturing method of an electro line for a liquid crystal display device includes depositing a barrier layer made of a conducting material on a substrate, depositing a copper layer (Cu) on the barrier layer, wet-etching the Cu layer using a first etchant, and dry-etching the barrier layer using a second etchant using the wet-etched Cu layer as an etch mask.

5 Claims, 8 Drawing Sheets

U.S. PATENT DOCUMENTS

| | | |
|---|---|---|
| 2002/0055323 A1 | 5/2002 | McClain et al. |
| 2003/0073311 A1 | 4/2003 | Levert et al. |
| 2003/0119221 A1 | 6/2003 | Cunningham et al. |

FOREIGN PATENT DOCUMENTS

| | | | | |
|---|---|---|---|---|
| JP | 2001059191 | | | 3/2001 |
| JP | 2001059191 | A | * | 3/2001 |
| KR | 1996-023218 | | | 7/1996 |
| KR | 1996-057408 | | | 7/1999 |
| KR | 2001-15041 | | | 2/2001 |
| KR | 2001-81966 | | | 8/2001 |

* cited by examiner

MANUFACTURING METHOD OF ELECTRO LINE FOR LIQUID CRYSTAL DISPLAY DEVICE

This application is a Divisional of application Ser. No. 10/315,151 filed Dec. 10, 2002 now U.S. Pat. No. 7,521,366, now allowed; which claims priority to Korean Patent Application Nos. 10-2001-0078557 and 10-2001-0078558, filed Dec. 12, 2001 all of which are hereby incorporated by reference for all purposes as if fully set forth herein.

BACKGROUND OF THE INVENTION

1. Field of the Invention

The present invention relates to a liquid crystal display (LCD) device and more particularly, to a manufacturing method of an electro line for a liquid crystal display (LCD) device.

2. Discussion of the Related Art

A liquid crystal display (LCD) device is widely used for notebook computers and desktop monitors, etc. because of its superior resolution, color image display and quality of displayed images.

In general, a liquid crystal display (LCD) device includes two substrates spaced apart and facing each other, and a liquid crystal material layer interposed between the two substrates. Each of the first and second substrates includes an electrode, whereby the electrodes of each of the first and second substrates face each other. When a voltage is applied to each of the electrodes, an electric field is induced between the electrodes. Accordingly, an alignment of the liquid crystal molecules of the liquid crystal material layer is changed by the varying intensity or direction of the induced electric field. Thus, the LCD device displays an image by varying transmittance of light through the liquid crystal material layer according to the arrangement of the liquid crystal molecules.

An active matrix LCD device, which has pixels in a matrix type, has been widely used because of high resolution and fast moving images. An array panel of the active matrix LCD device includes a plurality of thin film transistors (TFTs) and a plurality of pixel electrodes, each of which connects with each of TFTs.

A related art LCD device will be described hereinafter more in detail.

FIG. 1 is a plan view of an array substrate for a related art liquid crystal display device. In FIG. 1, a gate line 14 is formed horizontally in the context of the figure and a data line 20 is formed vertically in the context of the figure. The gate and data lines 14 and 20 cross each other to define a pixel region "P". At the crossing of the gate and data lines 14 and 20, a thin film transistor "T" is formed as a switching device, and the thin film transistor "T" is electrically connected to the gate and data lines 14 and 20. A pixel electrode 30 is formed in the pixel region "P", and the pixel electrode 30 is connected to the thin film transistor "T" through a drain contact hole 28.

The thin film transistor "T" includes a gate electrode 12 extended from the gate line 14, an active layer 18 overlapping the gate electrode 12, a source electrode 22 extended from the data line 20 and overlapping the active layer 18, and a drain electrode 24 spaced apart from the source electrode 22 and overlapping the active layer 18.

FIG. 2 is a cross-sectional view along the line II-II of FIG. 1. In FIG. 2, a gate electrode 12 is formed on a transparent substrate 1 and a gate insulator 16 is formed on the gate electrode 12. An active layer 18 made of amorphous silicon is formed on the gate insulator 16 and is positioned over the gate electrode 12. An ohmic contact layer 19 is formed on the active layer 18, and the ohmic contact layer 19 is made of doped amorphous silicon. Source and drain electrodes 22 and 24 are formed on the ohmic contact layer 19 and spaced apart from each other. The active layer 18 exposed between the source and drain electrodes 22 and 24 is a channel "ch" of a thin film transistor. A passivation layer 26 is formed on the source and drain electrodes 22 and 24, and the passivation layer 26 has a drain contact hole 28 exposing the drain electrode 24. A pixel electrode 30 is formed in a pixel region "P" on the passivation layer 26 and is connected to the drain electrode 24 through the drain contact hole 28.

Scanning signals or data signals from outer integrated circuits (not shown) are supplied to a liquid crystal panel including the array substrate illustrated above through the gate line or the data line. Each transistor turns on/off in regular sequence according to the scanning signal transmitted through the gate line. When the thin film transistor turns on, the data signal transmitted through the data line is supplied to the pixel electrode via the thin film transistor.

Recently, scanning time is becoming shorter and signaling speeds are increasing due to the large area and high resolution of the LCD device. The gate and data lines are made of material having low resistivity such as aluminum (Al) or aluminum alloy to prevent signal delay. However, Al is easily corroded by acid.

Therefore, copper (Cu), which has lower resistivity than Al and has strong chemical corrosion resistance, has been proposed as a material for the gate and data lines.

However, Cu has poor adhesive strength to a glass substrate, which is widely used as a substrate for the LCD device, and is easily diffused into a layer including silicon in relatively low temperature of about 200 degrees.

To solve the above problem, a structure having a titanium (Ti) layer as a barrier layer has been proposed.

FIGS. 3A to 3C show a manufacturing process of a gate line including a Cu layer in the related art.

In FIG. 3A, a gate line 32, which is composed of a titanium (Ti) layer 32a and a copper (Cu) layer 32b, is formed in a first region "A" on a substrate 1. A manufacturing process of the gate line 32 is as follows. First, the Ti layer 32a and the Cu layer 32b are subsequently deposited on the substrate 1. The Ti layer 32a functions as a barrier between the Cu layer 32b and the substrate 1. A photoresist pattern (not shown) is formed on the Cu layer 32b by coating, exposing, and developing a photoresist resin. The Cu layer 32b and the Ti layer 32a are subsequently etched using the photoresist pattern as a mask. Next, the photoresist pattern is stripped.

The Ti layer 32a is etched by an etchant including a fluoride ion ($F^-$). HF may be used as the etchant. The HF removes not only the Ti layer 32a but also the substrate 1, which is made of glass including silicon (Si). Therefore, the substrate 1 is also etched by a thickness of "C" in a second region "B", which does not have gate line 32 thereon, and the substrate 1 has a surface that is not flat.

As shown in FIG. 3C, a new gate line 34 is formed in place of the gate line 32 of FIG. 3A on the surface of the substrate 1 which is not flat. A reworking process of the gate line is shown in FIGS. 3B and 3C.

In FIG. 3B, the gate line 32 of FIG. 3A is removed. At this time, while the gate line 32 of FIG. 3A is removed, the substrate 1 in the second region "B" is also removed. Accordingly, the surface of the substrate 1 in the second region "B" has a step "D" above the surface of the substrate 1 in the region "A", wherein the step "D" is larger than the thickness "C". The flatness of the substrate 1 is much lower than in FIG. 3A.

In FIG. 3C, new gate line 34 is formed on the substrate 1 through the process in FIG. 3A. At this time, the gate line 34 may be formed on a borderline between the first region "A" and the second region "B" because of a process margin. Then, the gate line 34 has an uneven surface along the step "D" of the substrate 1, which leads to poor patterns being formed on the gate line.

FIG. 4 shows a manufacturing process of source and drain electrodes including a Cu layer in the related art. In FIG. 4, a gate line 32 is formed on a substrate 1 and a gate insulator 36 is formed on the gate line 32. The gate line 32 is made of two layers of a Ti layer 32a and a Cu layer 32b. The Ti layer 32a functions as a barrier between the Cu layer 32b and the substrate 1. An active layer (not shown) and an ohmic contact layer (not shown) are subsequently formed on the gate insulator 36. Though not shown in the figure, source and drain electrodes made of a Ti layer and a Cu layer are formed on the ohmic contact layer by depositing and patterning the Ti layer and the Cu layer. The Ti layers of the source and drain electrodes are etched by an etchant including a fluoride ion ($F^-$). Thus, the gate insulator including silicon may be etched by the etchant, and the gate electrode 32 may be exposed in a step area "E", where the gate insulator 36 has worse properties than in other regions.

SUMMARY OF THE INVENTION

Accordingly, the present invention is directed to a manufacturing method of an electro line for a liquid crystal display (LCD) device that substantially obviates one or more of problems due to limitations and disadvantages of the related art.

An advantage of the present invention is to provide a manufacturing method of an electro line for a liquid crystal display (LCD) device, wherein the electro line has low resistivity and strong chemical corrosion resistance.

Another advantage of the present invention is to provide a manufacturing method of an electro line for a liquid crystal display (LCD) device having a large area and high resolution.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a manufacturing method of an electro line for a liquid crystal display device includes depositing a barrier layer made of a conducting material on a substrate; depositing a copper layer (Cu) on the barrier layer; wet-etching the Cu layer by a first etchant; and dry-etching the barrier layer using a second etchant using the wet-etched Cu layer as an etch mask.

In another aspect of the present invention, a manufacturing method of an electro line for a liquid crystal display device includes depositing a molybdenum (Mo) layer on a substrate, depositing a copper (Cu) layer on the Mo layer, and subsequently patterning the Cu layer and the Mo layer using an etchant including base materials and an additive, the base materials including an oxidizing agent and an acid, the additive lowering potential difference between the Mo layer and the Cu layer.

In another aspect of the present invention, a liquid crystal display device includes an electro line made by the process mentioned above.

In another aspect of the present invention, a thin film transistor for a liquid crystal display device includes a substrate; a gate electrode on the substrate, wherein the gate electrode includes a barrier layer formed by a dry etching method and a copper (Cu) layer formed by a wet etching method; a gate insulator on the gate electrode; an active layer on the gate insulator; an ohmic contact layer on the active layer; and source and drain electrodes on the ohmic contact layer.

In another aspect of the present invention, an array substrate for a liquid crystal display device includes the thin film transistor mentioned above.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, examples of which is illustrated in the accompanying drawings.

FIGS. 5A to 5D are cross-sectional views showing a manufacturing process of an electro line for a liquid crystal display device according to a first embodiment of the present invention.

Figure 1:
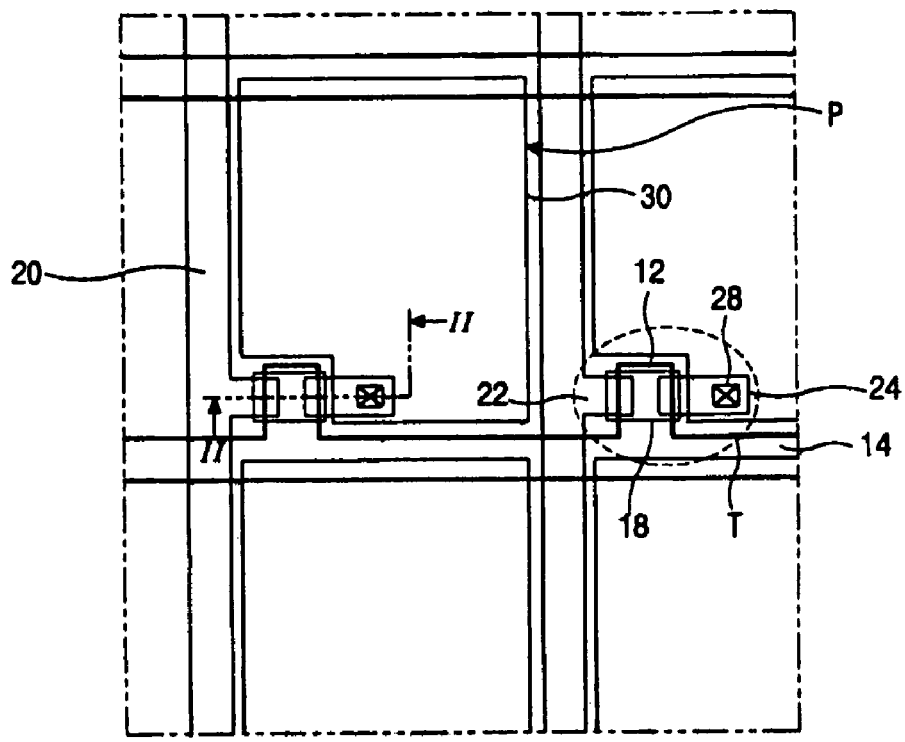
FIG. 1 is a plan view of an array substrate for a related art liquid crystal display device.
Figure 2:
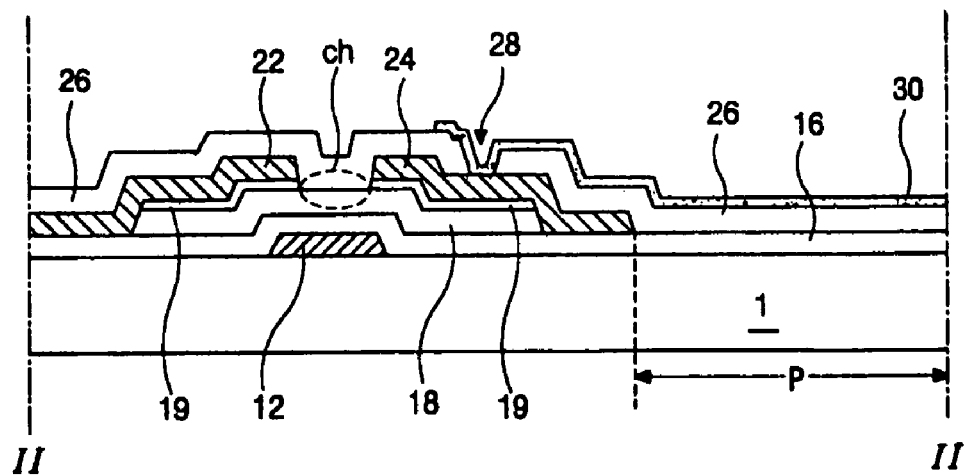
FIG. 2 is a cross-sectional view of the array substrate along the line II-II of FIG. 1.
Figure 3A:
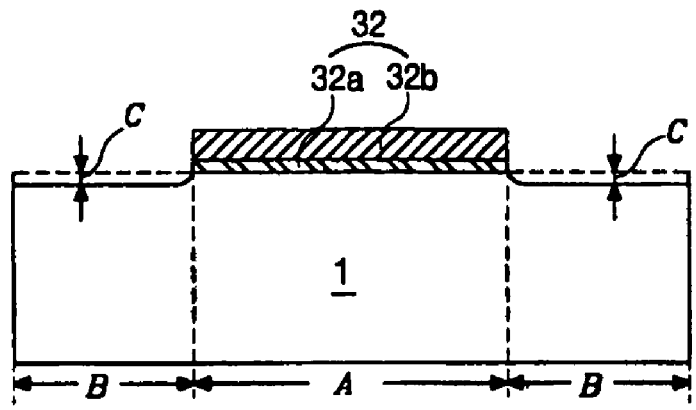
FIGS. 3A to 3C are cross-sectional views showing a manufacturing process of a gate line including a Cu layer in the related art.
Figure 3B:
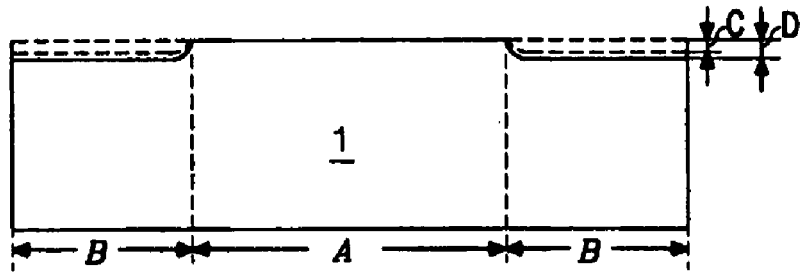
Figure 3C:
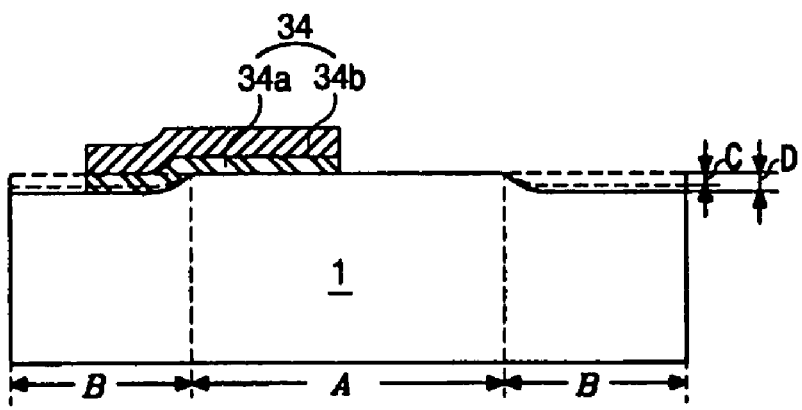
Figure 4:
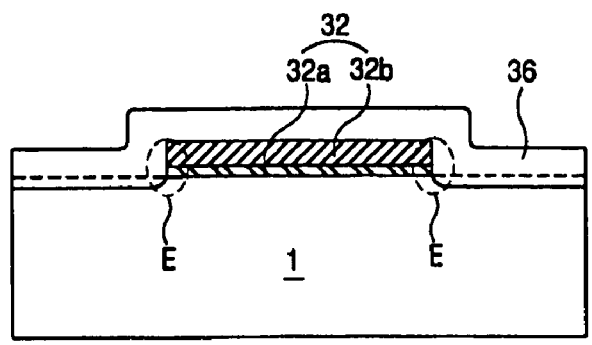
FIG. 4 is a cross-sectional view showing a manufacturing process of source and drain electrodes including a Cu layer in the related art.
Figure 5A:
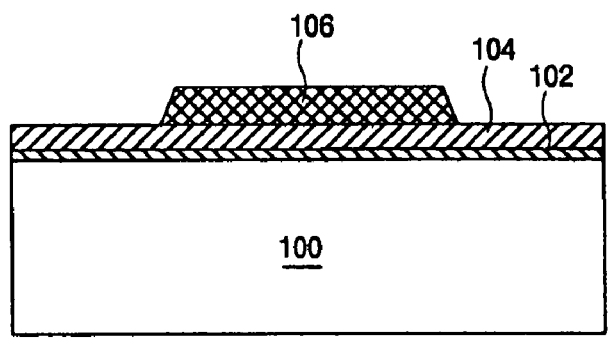
FIGS. 5A to 5D are cross-sectional views showing a manufacturing process of an electro line for a liquid crystal display device according to a first embodiment of the present invention.

In FIG. 5A, a barrier layer 102 and a Cu layer 104 are subsequently deposited on a transparent substrate 100. A photoresist pattern 106 is formed on the Cu layer 104 by coating, exposing and developing a photoresist resin. The barrier layer 102 is made of a metal material that has strong chemical corrosion resistance and can be etched by an etchant, which does not include fluorine (F). For example, the barrier layer 102 may be made of one of molybdenum (Mo) and chromium (Cr). The transparent substrate 100 may be made of a material including silicon such as glass.

Figure 5B:
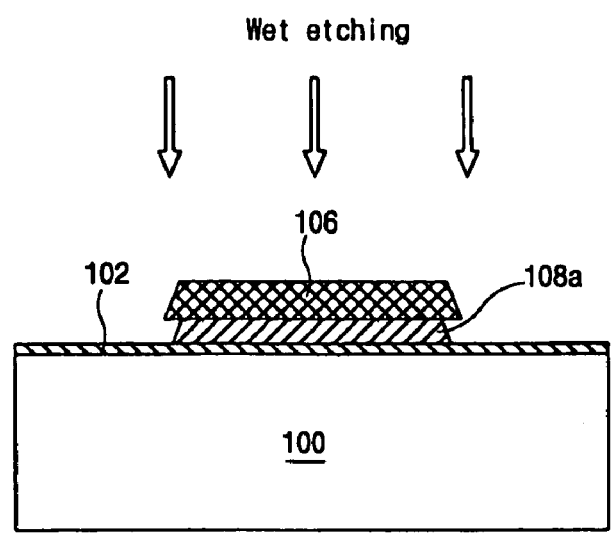

In FIG. 5B, the Cu layer 104 of FIG. 5A is wet-etched by a first etchant, and a first metal line 108a is formed. The photoresist pattern 106 is used as an etch mask. The first etchant is made of a material that does not etch the barrier layer 102, and the first etchant may include oxone ($2KHSO_5.K_2SO_4.KHSO_4$). The concentration of the oxone is within a range of about 1 wt. % to about 20 wt. % and for example, is within a range of about 2 wt. % to about 5 wt. %.

Figure 5C:
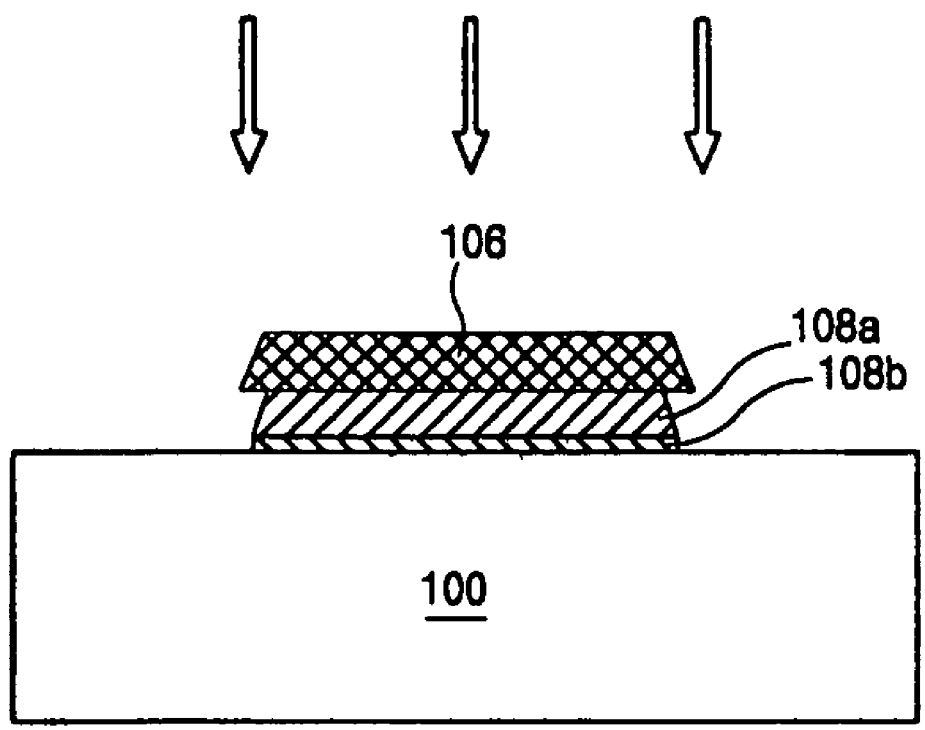

In FIG. 5C, the barrier layer 102 of FIG. 5B is dry-etched by a second etchant using the first metal line 108a as an etching mask, and a second metal line 108b is formed. The dry etching of the barrier layer 102 is accomplished in an etching chamber of vacuum condition, and the second etchant may include chlorine ($Cl_2$) and oxygen ($O_2$) gases. Therefore, chlorine ($Cl_2$) and oxygen ($O_2$) gases flow into the etching chamber at flow rates of about 200 sccm (standard cubic centimeter per minute) and about 200 sccm, respectively, and the dry etching is accomplished under a pressure of about 250 mTorr and an electric power of about 800 W. At this time, an etch rate of the barrier layer 102 of FIG. 5B is about 1,000 Å/min.

Here, an ashing process using $O_2$ gas can be done before the dry etching in order to remove a photoresist resin remaining on the substrate 100 except for the photoresist pattern 106.

Figure 5D:
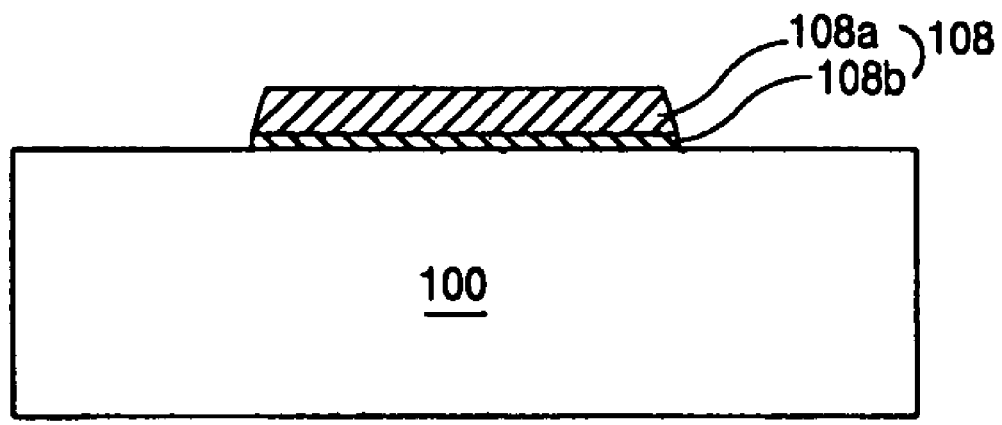

Next, as shown in FIG. 5D, the photoresist pattern 106 of FIG. 5C is stripped, and then an electro line 108 composed of the first and second metal lines 108a and 108b is completed.

In the first embodiment of the present invention, since the barrier layer and the Cu layer are etched in different processes, i.e., the wet-etching and the dry-etching, galvanic effect is minimized and etching properties of the electro line are improved.

Figure 6:
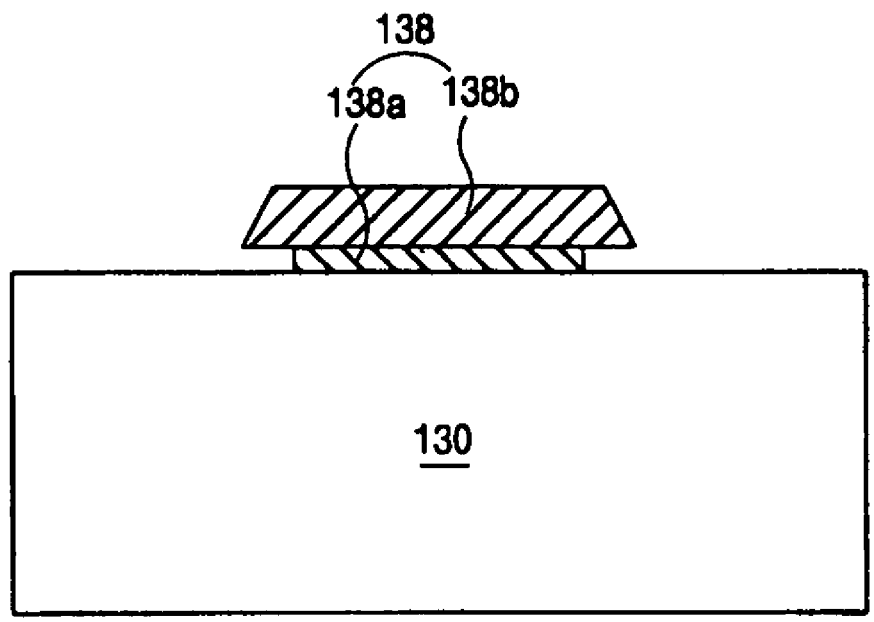
FIG. 6 is a cross-sectional view of an electro line for a liquid crystal display device made by a second embodiment of the present invention.

FIG. 6 is a cross-sectional view of an electro line for a liquid crystal display device made by a second embodiment of the present invention. In FIG. 6, an electro line 138 composed of a first metal layer 138a and a second metal layer 138b are formed on a substrate 130. The first metal layer 138a is made of Mo and the second metal layer 138b is made of Cu. Here, the first and second metal layers 138a and 138b are subsequently etched by an etchant including an oxidizing agent and an acid. The oxidizing agent may include hydrogen peroxide ($H_2O_2$) and the acid may include acetic acid ($CH_3COOH$). The etching mechanism used by the etchant is as follows.

$$Cu+H_2O_2 \rightarrow CuO+H_2O \qquad (1)$$

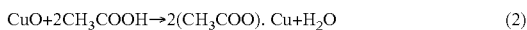
$$CuO+2CH_3COOH \rightarrow 2(CH_3COO).Cu+H_2O \qquad (2)$$

$$Mo+3H_2O_2=MoO_3+3H_2O \qquad (3)$$

In the second embodiment, since the first and second metal layers 138a and 138b are etched by the etchant in one process, the number of manufacturing steps decreases. However, the first metal layer 138a is over-etched because of the potential difference between Cu and Mo. That is, as the Cu layer 138b has a potential of about −0.3 eV and the Mo layer 138a has a potential of about 0.2 eV, the etching reactivity of the Mo layer 138a having a larger potential than the Cu layer 138b increases due to a galvanic phenomenon. Therefore, the undercut of the Mo layer 138a occurs.

Because of the undercut of the Mo layer 138a, the electro line 138 has poor taper properties and a current-voltage characteristic of the electro line 138 is lowered.

Figure 7A:
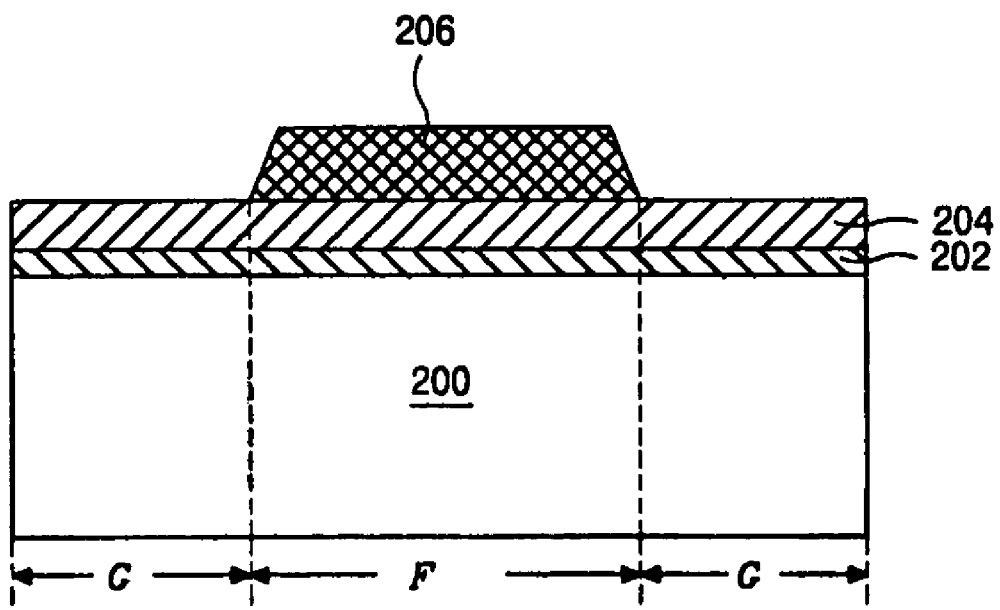
FIGS. 7A to 7C are cross-sectional views showing a manufacturing process of an electro line for a liquid crystal display device according to a third embodiment of the present invention.
Figure 7B:
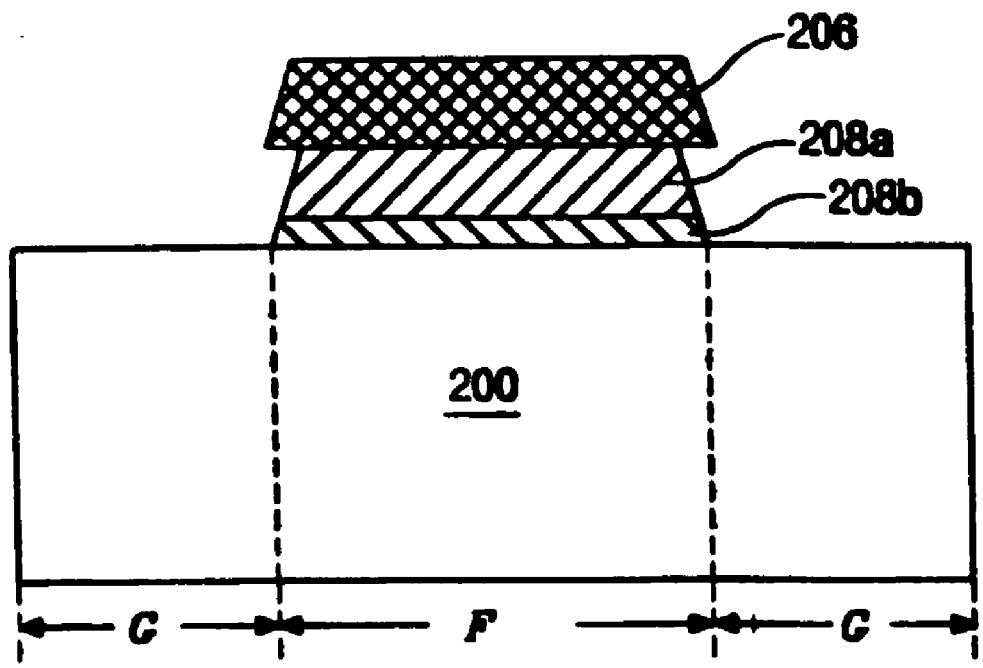
Figure 7C:
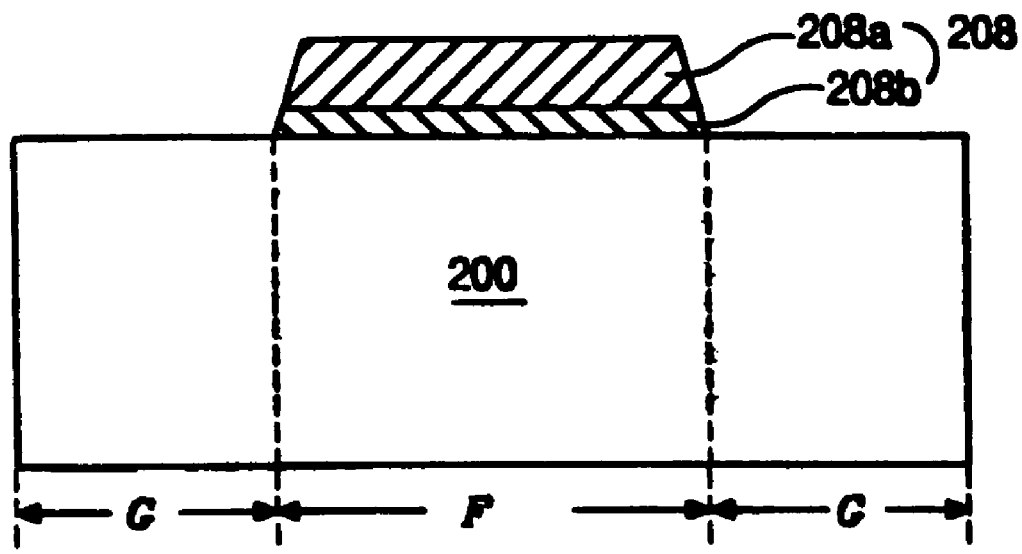

FIGS. 7A to 7C show a manufacturing process of an electro line for a liquid crystal display device according to a third embodiment of the present invention.

In FIG. 7A, a Mo layer 202 and a Cu layer 204 are subsequently deposited on a transparent substrate 200. The transparent substrate 200 includes a first region "F" and a second region "G". A photoresist pattern 206 is formed in a first region "F" on the Cu layer 204 by coating, exposing, and developing a photoresist material. The transparent substrate 200 may be made of glass.

In FIG. 7B, the Cu layer 204 and the Mo layer 202 of FIG. 7A are subsequently etched by an etchant, which includes base materials and an additive, using the photoresist pattern 206 as an etch mask, and a first metal line 208a and a second metal line 208b are formed. The base materials include an oxidizing agent and an acid, and the additive lowers potential difference between Mo and Cu. The oxidizing agent may include hydrogen peroxide ($H_2O_2$) and the acid may include acetic acid ($CH_3COOH$). The additive may include ammonium acetate ($CH_3COONH_4$). The added rate of the additive can be changed. The additive may be mixed with the base materials after being dissolved in de-ionized water.

Next, in FIG. 7C, the photoresist pattern 206 of FIG. 7B is stripped, and the electro line 208, which is composed of the first metal line 208a made of Cu and the second metal line 208b made of Mo, is completed.

In the third embodiment of the present invention, since the electro line is formed by the etchant including the additive such as ammonium acetate ($CH_3COONH_4$), the number of manufacturing processes decreases, and undercut of the Mo layer can be prevented. Moreover, as the etchant does not include fluorine (F), the substrate is not etched in the second region "G".

Figure 8:
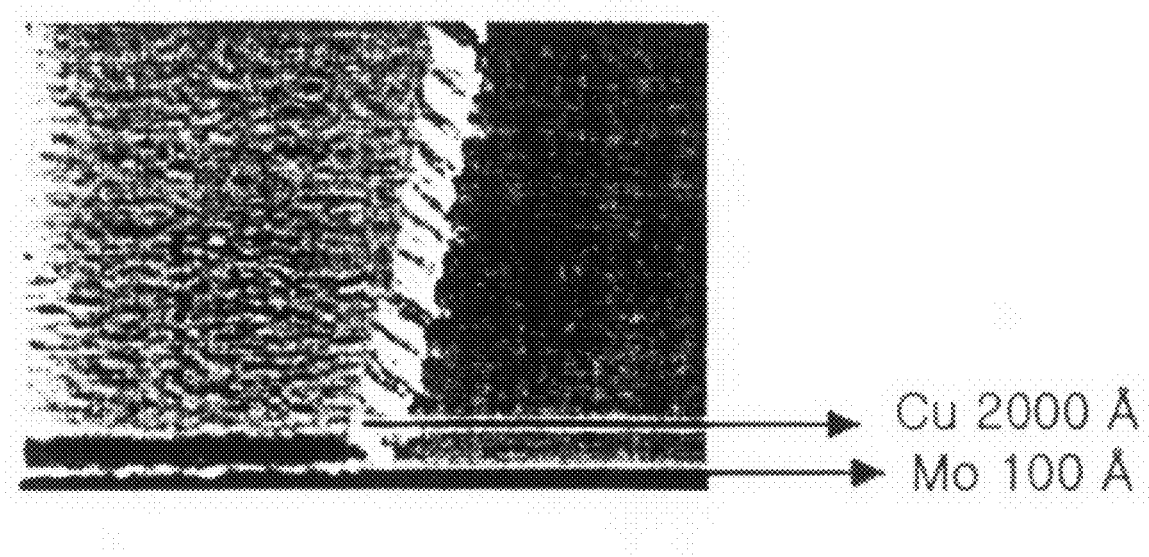
FIG. 8 is a picture of an electro line made by the third embodiment of the present invention.

FIG. 8 shows a picture of an electro line made by the third embodiment of the present invention. In FIG. 8, the electrode line includes a Mo lower layer and a Cu upper layer. The Mo layer has a thickness of about 100 Å and the Cu layer has a thickness of about 2,000 Å. Here, the etch time of the electro line is about 50 seconds.

As shown in FIG. 8, uniform patterns are observed in a step area between the Cu layer and the Mo layer.

Figure 9:
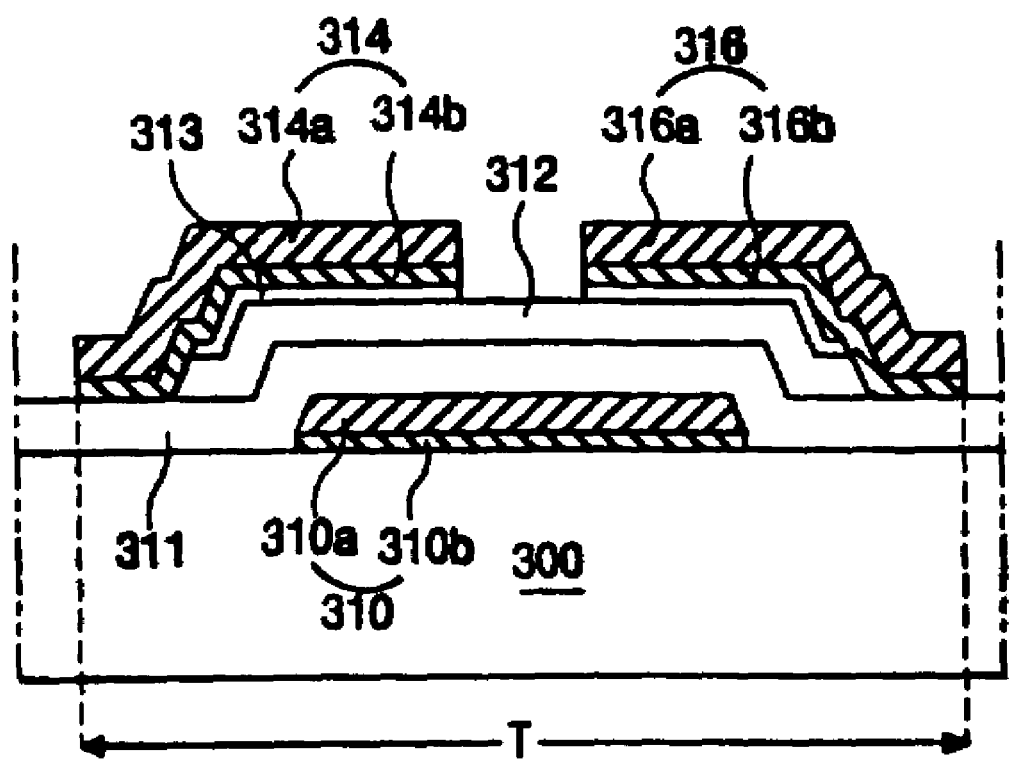
FIG. 9 is a cross-sectional view of a thin film transistor for a liquid crystal display device formed by an embodiment of the present invention.

FIG. 9 is a cross-sectional view of a thin film transistor for a liquid crystal display device formed by an embodiment of the present invention.

In FIG. 9, a gate electrode 310 is formed on a substrate 300 and a gate insulator 311 is formed on the gate electrode 310. The gate electrode 310 is composed of a first layer 310b made of Mo and a second layer 310a made of Cu. An active layer 312 is formed on the gate insulator 311 and an ohmic contact layer 313 is formed on the active layer 312. The active layer 312 is made of amorphous silicon and the ohmic contact layer 313 is made of doped amorphous silicon. Next, source and drain electrodes 314 and 316 are formed on the ohmic contact layer 313 and spaced apart from each other. The source and drain electrodes 314 and 316 are also composed of two layers. First layers 314b and 316b of the source and drain electrodes 314 and 316 are made of Mo and second layers 314a and 316a of the source and drain electrodes 314 and 316 are made of Cu.

The gate electrode 310 and the source and drain electrodes 314 and 316 may be formed by one method of the first embodiment and the third embodiment of the present invention.

The present invention provides a manufacturing method of an electro line for a liquid crystal display (LCD) device, wherein the electro line has low resistivity and strong chemical corrosion resistance.

The present invention provides a manufacturing method of an electro line for a liquid crystal display (LCD) device having a large area and high resolution.

The gate and data lines are made of material having low resistivity that prevents signal delay. The material has good adhesive strength to a glass substrate, which is widely used as a substrate for the LCD device, and is not easily diffused into a layer including silicon in relatively low temperature of about 200 degrees. The gate line does not have an uneven surface, which leads to good patterns being formed on the gate line.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A manufacturing method of an electro line for a liquid crystal display device, comprising:

depositing a molybdenum (Mo) layer on a substrate;
depositing a copper (Cu) layer on the Mo layer; and
subsequently patterning the Cu layer and the Mo layer by an etchant including base materials and an additive, the base materials including an oxidizing agent and an acid, the additive including ammonium acetate ($CH_3COONH_4$) lowering a potential difference between the Mo layer and the Cu layer.

2. The method according to claim 1, wherein the oxidizing agent includes hydrogen peroxide ($H_2O_2$) and the acid includes acetic acid ($CH_3COOH$).

3. The method according to claim 1, wherein the additive includes de-ionized water.

4. The method according to claim 1, wherein the Mo layer has a thickness within a range of about 50 Å to about 200 Å.

5. The method according to claim 1, wherein the Cu layer has a thickness within a range of about 1,500 Å to about 2,500 Å.

* * * * *